United States Patent
Alessi et al.

(10) Patent No.: US 12,054,386 B2
(45) Date of Patent: Aug. 6, 2024

(54) ANALYSIS METHOD OF A DEVICE, PERFORMED THROUGH A MEMS SENSOR, AND SYSTEM THEREOF INCLUDING THE DEVICE AND THE MEMS SENSOR

(71) Applicant: STMicroelectronics S.r.l., Agrate Brianza (IT)

(72) Inventors: Enrico Rosario Alessi, Catania (IT); Fabio Passaniti, Syracuse (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 285 days.

(21) Appl. No.: 17/175,410

(22) Filed: Feb. 12, 2021

(65) Prior Publication Data
US 2021/0253419 A1    Aug. 19, 2021

(30) Foreign Application Priority Data
Feb. 17, 2020 (IT) .................. 102020000003152

(51) Int. Cl.
*B81B 7/00* (2006.01)
*B81B 7/02* (2006.01)
*G06N 3/08* (2023.01)

(52) U.S. Cl.
CPC .............. *B81B 7/007* (2013.01); *B81B 7/02* (2013.01); *G06N 3/08* (2013.01);
(Continued)

(58) Field of Classification Search
None
See application file for complete search history.

(56) References Cited

U.S. PATENT DOCUMENTS 3,295,355 A    1/1967 Fisher et al.
9,846,037 B2    12/2017 Aaltonen
(Continued)

FOREIGN PATENT DOCUMENTS

WO    2016/113653 A1    7/2016

OTHER PUBLICATIONS

Allen et al., "Self-Testable Accelerometer Systems," IEEE Micro Electro Mechanical Systems, Proceedings, 'An Investigation of Micro Structures, Sensors, Actuators, Machines and Robots', Salt Lake City, UT, USA, 1989, pp. 113-115.
(Continued)

*Primary Examiner* — Hrayr A Sayadian
(74) *Attorney, Agent, or Firm* — Seed IP Law Group LLP

(57) ABSTRACT

An analysis method of a device through a MEMS sensor is provided in which the MEMS sensor includes a control unit and a sensing assembly coupled to the device. The analysis method includes acquiring, through the sensing assembly, first data indicative of an operative state of the device. Testing is performed for the presence of a first abnormal operating condition of the device. If the first abnormal operating condition of the device is confirmed, a self-test of the sensing assembly is performed to generate a quantity indicative of an operative state of the sensing assembly. The self-test includes acquiring, through the sensing assembly, second data indicative of the operative state of the sensing assembly, generating a signature according to the second data, and processing the signature through deep learning techniques to generate said quantity.

9 Claims, 9 Drawing Sheets

(52) U.S. Cl.
CPC ............... *B81B 2201/0235* (2013.01); *B81B 2201/0242* (2013.01); *B81B 2201/0257* (2013.01); *B81B 2201/0264* (2013.01); *B81B 2201/0278* (2013.01); *B81B 2201/0292* (2013.01)

(56) References Cited

U.S. PATENT DOCUMENTS

| | | |
|---|---|---|
| 2013/0265070 A1 | 10/2013 | Kleks et al. |
| 2016/0273346 A1* | 9/2016 | Tang ................ E21B 43/04 |
| 2017/0168088 A1 | 6/2017 | Coronato et al. |
| 2019/0339687 A1* | 11/2019 | Cella ................ H04L 1/18 |
| 2020/0006988 A1* | 1/2020 | Leabman ............ A61B 8/56 |
| 2020/0103894 A1* | 4/2020 | Cella ................ G06N 3/084 |
| 2021/0002126 A1 | 1/2021 | Alessi et al. |
| 2021/0003524 A1 | 1/2021 | Passaniti et al. |
| 2022/0217210 A1* | 7/2022 | Alessi ............... H04L 67/12 |

OTHER PUBLICATIONS

Charlot et al., "Electrically Induced Stimuli for MEMS self-test," Proceedings 19$^{th}$ IEEE VLSI Test Symposium, Marina Del Rey, CA, USA, 2001, pp. 1-6.

Jamborhazi et al., "Constant frequency drive method for MEMS for improved failure detection," 2015 Symposium on Design Test Integration and Packaging of MEMS and MOEMS, 6 pages.

Maliuk et al., "Analog Neural Network Design for RF Built-In Self-Test," IEEE International Test Conference, Austin, TX, USA, 2010, pp. 1-10.

Reyntjens et al., "RASTA: the Real-Acceleration-for-Self-Test Accelerometer," Transducers '01, Eurosensors XV, The 11$^{th}$ International Conference on Solid-State Sensors and Actuators, Munich, Germany, Jun. 10-14, 2001, pp. 434-437.

* cited by examiner

ANALYSIS METHOD OF A DEVICE, PERFORMED THROUGH A MEMS SENSOR, AND SYSTEM THEREOF INCLUDING THE DEVICE AND THE MEMS SENSOR

BACKGROUND

Technical Field

The present disclosure relates to an analysis method of a device, performed through a MEMS sensor, and system thereof including the device and the MEMS sensor.

Description of the Related Art

As is known, the sensors of a "Micro Electro-Mechanical Systems", MEMS, type integrated in electronic devices deployed in applications such as airbags, biosensors, industrial and aerospace applications, currently significantly contribute to the success of these devices on the market. Furthermore, the small size, the low power required for the operation, the ease of integration, the high functionality and the high performance provided by MEMS sensors allow the innovation and progress of electronic devices such as smartphones, game controllers, activity trackers and digital frames. The MEMS sensors have also significantly improved the reliability of the electronic devices and, in addition, reduced costs in safety systems, for example, in the automotive field, reaching the point of being installed in most cars. For example, MEMS accelerometers are currently used as a low-cost technology for monitoring the equipment vibrations in the "automotive" field in order to activate lubrication feedback checks, to modify the speed or tension of belts and to stop the equipment in case of need for maintenance by staff.

On the other hand, the measurements performed by MEMS sensors may result in false positives or false negatives due to damage to the same MEMS sensors and/or degradation of their performances (for example, due to the unfavorable working conditions to which they may be subjected). The possible failure and/or degradation modes depend on the type of MEMS sensor. For example, in connection with a pressure sensor the following failure modes are commonly known: clogging of holes present in a pressure sensor packaging and adapted to fluidically connect a pressure sensor sensitive membrane to the outside of the pressure sensor (i.e., with an external volume); aging effects; clock signal trimming; flaws in digital control; and damages to membranes included in the MEMS sensor.

The need is therefore felt to develop an efficient analysis and test solution for MEMS sensors to optimize throughput and reliability thereof.

Known solutions to this problem comprise performing an integrated testing process, also known as "self-test". Considering a system including a device (for example, an electronic device) and the MEMS sensor, the MEMS sensor and such device being operatively coupled to each other through a sensing element comprised in the MEMS sensor, an operating state of the device may be determined based on measurements performed by the MEMS sensor. However, a malfunction of the MEMS sensor may lead to incorrect measurements, and therefore to a discrepancy between such determined operating state and a real operating state of the device. The self-test allows to ascertain the correct operation of the MEMS sensor, and thus the validity of the device operating state determined therethrough.

In particular, in MEMS sensors including a control unit (such as an "Application Specific Integrated Circuit", ASIC) and the sensing element of a MEMS type, mutually coupled to each other, the self-test may comprise both a control unit examination step and a sensing element examination step.

The control unit examination step is performed by inputting known signal schemes to the control unit, acquiring outputs (for example, electrical signals) of the control unit, and comparing such outputs with respective "target" or nominal outputs, to sense possible control unit anomalies.

The sensing element examination step is instead performed through a specific MEMS test structure further comprised in the MEMS sensor and dedicated to test the correct operation of the sensing element. In particular, both the sensing element and such MEMS test structure are stimulated by means of internal or external stimuli, respective outputs (for example, electrical signals) of the sensing element and of the MEMS test structure are acquired and compared to each other to sense possible anomalies of the sensing element. In the exemplary case wherein the MEMS sensor includes an accelerometer, when the self-test function is enabled, an electrostatic force is applied to the sensing element (accelerometer) and to the MEMS test structure, causing movable parts of the sensing element and of the MEMS test structure to move away from resting positions thereof and thus emulating a solicitation to which the MEMS sensor is subjected due to an external force acting thereon. Output signals acquired in the self-test mode by the sensing element and the MEMS test structure are then compared to each other to sense possible anomalies in the sensing element.

In particular, FIG. 1 shows a known analysis method of the device coupled to the MEMS sensor.

The analysis method is performed iteratively through the control unit, and starts at a step S0. For example, at step S0 the system (and therefore both the device and the MEMS sensor) goes from an "OFF state" to an "ON state" following a manual selection by an operator or an automatic switch-on control.

At a step S1, consecutive to step S0, a self-test condition is tested. In particular, at step S1 it is tested whether the self-test function is enabled, i.e., whether the sensing element is desired to be tested for the correct operation thereof. For example, the control unit may acquire, through interface means of a per se known type (such as displays and keyboards) operable by the operator and operatively coupled to the control unit, a self-test command indicative of the self-test condition. Alternatively, the self-test condition may be selected and automatically controlled by the control unit or the device, for example, by enabling the self-test function every time the device is switched on. The self-test command may be a logic signal indicating, upon assuming a first value (for example, 1), the self-test function as being enabled, and indicating, upon assuming a second value (for example, 0), the self-test function as being disabled.

If the self-test function is disabled (exit "N" of step S1), a step S2 follows wherein the control unit acquires first data through the sensing element. Such first data includes the measurement performed by the sensing element, and is indicative of the properties (i.e., the operating state) of the device.

At step S3, consecutive to step S2, an operation alarm condition is tested. In particular, at step S3 it is tested whether the measurement acquired at step S2 meets a first relation: for example, if the value of such measurement is within a first range having a minimum value and a maximum value, the device operating state is normal and no abnormal condition has occurred; if the value of such measurement is not within the first range (i.e., it is lower than the minimum value of the first range or is higher than the maximum value of the first range), the device operating state is abnormal.

If the device operating state is abnormal (exit "Y" of step S3), an operating alarm is generated at step S4 in order to signal such anomaly to the operator. For example, the operating alarm includes a notification message shown to the operator through the interface means, or a light and/or acoustic signal generated by signaling means (such as LED, earphone or loudspeaker) controlled by the control unit.

At step S5, consecutive to step S4, an ON state of the system is tested. In other words, at step S5 it is tested whether the device and the MEMS sensor remain in the ON state.

If the system is in the ON state (exit "Y" of step S5), the test of the self-test condition is repeated, thus returning to step S1.

If the system is in the OFF state (exit "N" of step S5), the analysis method ends at step S10.

If, instead, the device operating state is normal (exit "N" of step S3), the analysis method proceeds directly to step S5 for testing the system ON state.

Furthermore, if the self-test function is enabled (exit "Y" of step S1), a step S6 follows wherein the control unit acquires second data from the sensing element and from the MEMS test structure. Such second data includes the measurements performed by both the sensing element and the MEMS test structure.

At step S7, consecutive to step S6, a self-test alarm condition is tested. In particular, at step S7 it is tested whether the measurements acquired at step S6 satisfy a second relation: for example, if the absolute value of the difference between the output of the sensing element and the output of the MEMS test structure is within a second range (having a minimum value and a maximum value), the sensing element operates normally and correctly; vice versa, if such absolute value of the difference between the output of the sensing element and the output of the MEMS test structure is not within the second range (i.e., it is lower than the minimum value of the second range or is higher than the maximum value of the second range), the operation of the sensing element is abnormal.

If the sensing element operation is abnormal (exit "Y" of step S7), a self-test alarm is generated at step S8 in order to signal such anomaly to the operator. The self-test alarm is similar to the operating alarm, and therefore may include a notification message shown to the operator through the interface means or a light and/or acoustic signal generated by the signaling means.

After the generation of the self-test alarm, the ON state of the system is tested again, going to step S8.

If, instead, the sensing element operation is normal (exit "N" of step S7), the analysis method proceeds directly to step S5 for testing the ON state of the system.

The self-test thus requires a dedicated and specific design of the MEMS sensor. The disadvantages of such known solution are multiple, and in particular relate to the increase in the complexity, size and cost of the MEMS sensor. Furthermore, during the self-test (i.e., during the execution of steps S6, S7, S8) both the MEMS sensor and the device it is connected to are to suspend their normal operation and are not operating, and this reduces the system overall performance and increases the time required to perform the respective functions.

BRIEF SUMMARY

In various embodiments, the present disclosure provides an analysis method of a device, performed through a MEMS sensor, and which overcomes the drawbacks of the prior art.

According to the present disclosure an analysis method of a device, performed through a MEMS sensor, and a system thereof including the device and the MEMS sensor are provided.

In at least one embodiment, an analysis method of a device through a Micro Electro-Mechanical Systems (MEMS) sensor is provided in which the MEMS sensor includes a control unit and a sensing assembly operatively coupled to the device and to the control unit. The analysis method includes: acquiring, by the control unit and through the sensing assembly, first data indicative of an operating state of the device; testing, by the control unit, for the presence of a first abnormal operating condition of the device, by testing whether the first data meets a defined relationship with respect to one or more reference values; and if the first abnormal operating condition of the device is confirmed, performing, by the control unit, a self-test of the sensing assembly to generate a quantity indicative of an operative state of the sensing assembly. The self-test includes: acquiring, by the control unit and through the sensing assembly, second data indicative of the operative state of the sensing assembly; generating, by the control unit, a signature according to the second data; and processing, by a deep learning module operatively coupled to the control unit, the signature through deep learning techniques to generate said quantity.

In at least one embodiment, a system is provided that includes a device and a MEMS sensor. The MEMS sensor includes a sensing assembly operatively coupled to the device, and a control unit operatively coupled to the sensing assembly. The control unit is configured to: acquire, through the sensing assembly, first data indicative of an operative state of the device; test for the presence of a first abnormal operating condition of the device, by testing whether the first data meets a defined relation with respect to one or more reference values; and if the first abnormal operating condition of the device is confirmed, performing a self-test of the sensing assembly to generate a quantity indicative of an operative state of the sensing assembly. The control unit is further configured to: acquire, through the sensing assembly, second data indicative of the operative state of the sensing assembly; and generate a signature according to the second data. A deep learning module is operatively coupled to the control unit and is configured to process the signature through deep learning techniques to generate said quantity.

In at least one embodiment, a Micro Electro-Mechanical Systems (MEMS) sensor is provided that includes a sensing assembly configured to be coupled to a device, and control circuitry operatively coupled to the sensing assembly. The control circuitry is configured to: acquire, through the sensing assembly, first data indicative of an operative state of the device; test for the presence of a first abnormal operating condition of the device, by testing whether the first data meets a defined relation with respect to one or more reference values; and if the first abnormal operating condition of the device is confirmed, performing a self-test of the sensing assembly to generate a quantity indicative of an operative state of the sensing assembly. The self-test includes: acquiring, by the control circuitry and through the sensing assembly, second data indicative of the operative state of the sensing assembly; generating, by the control circuitry, a signature according to the second data; and processing, by a deep learning module operatively coupled to the control unit, the signature through deep learning techniques to generate said quantity.

BRIEF DESCRIPTION OF THE SEVERAL VIEWS OF THE DRAWINGS

For a better understanding of the present disclosure, some embodiments thereof are now described, purely by way of non-limiting example, with reference to the appended drawings, wherein.

DETAILED DESCRIPTION

Elements, steps and stages common to different embodiments of the present disclosure are indicated below with the same reference numbers.

Figure 1:
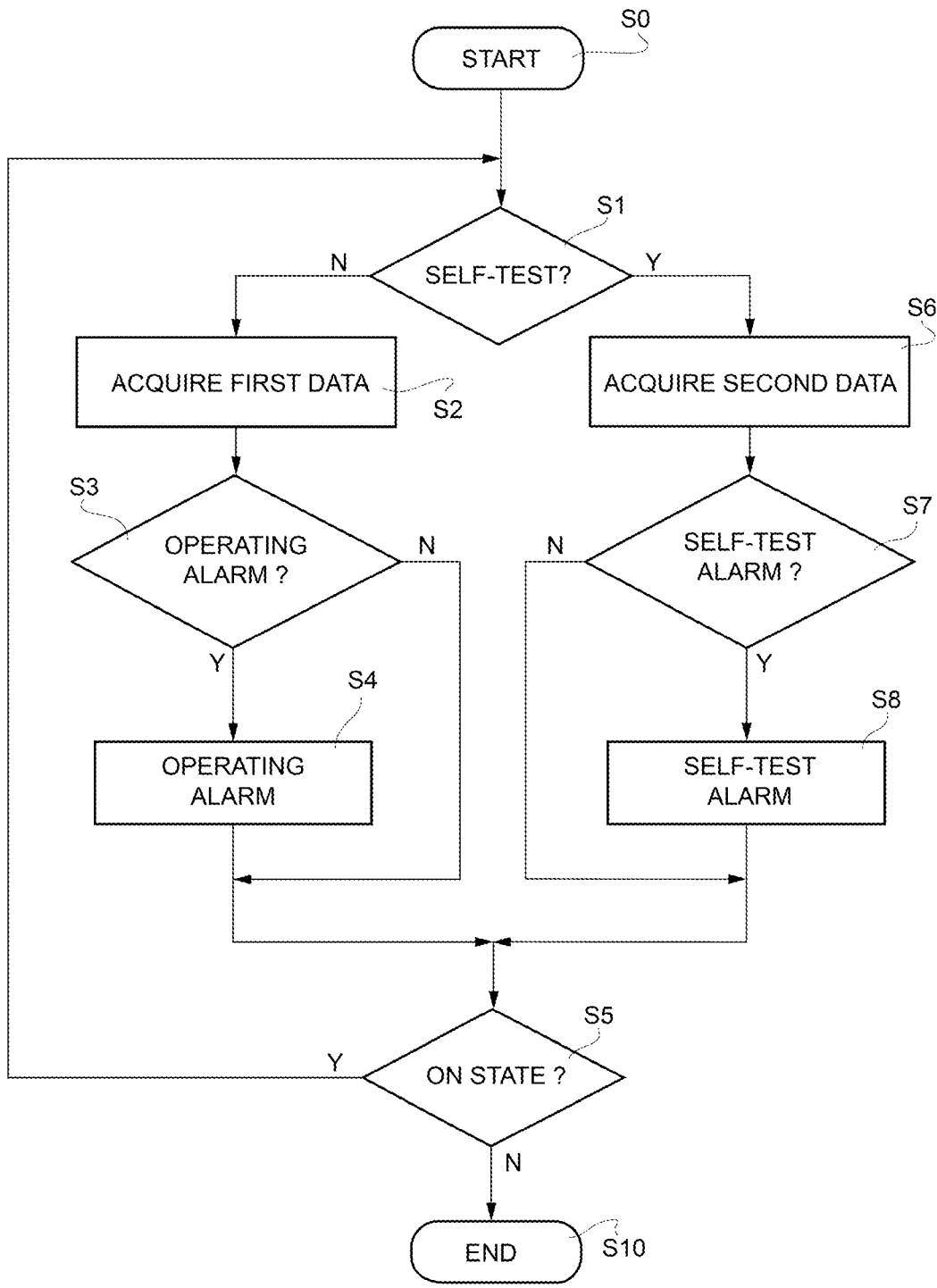
FIG. 1 shows a block diagram of a known analysis method of a MEMS sensor.
Figure 2:
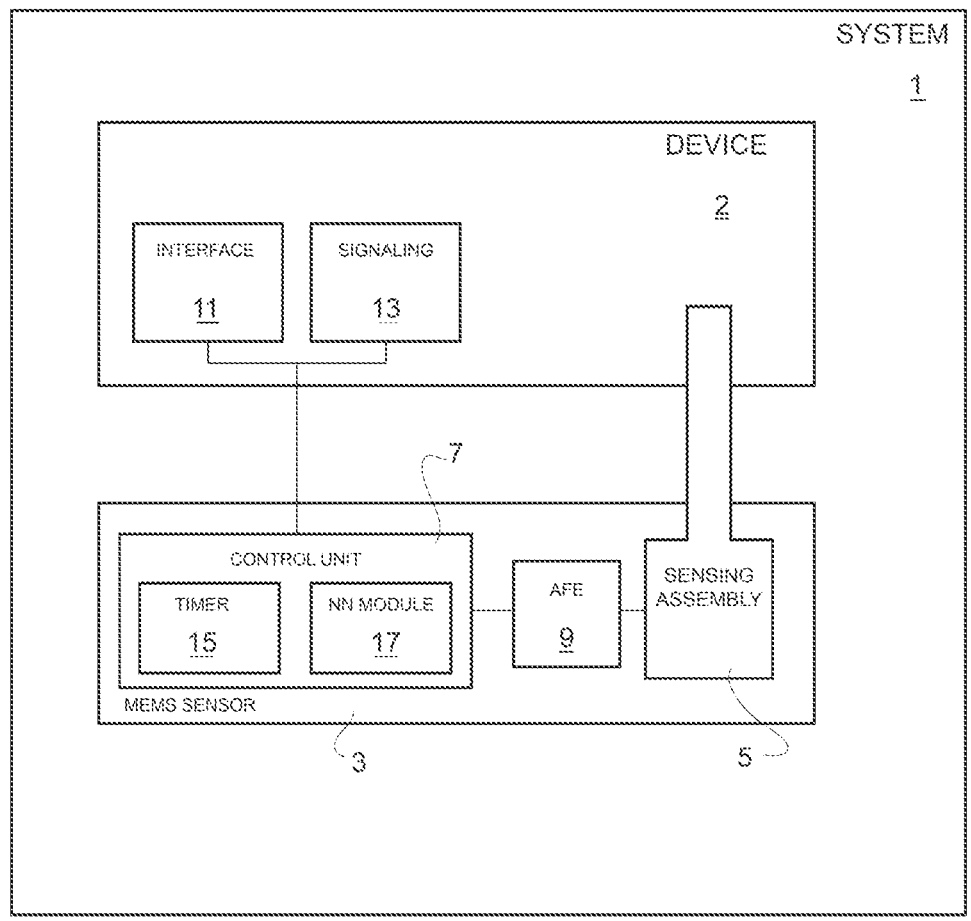
FIG. 2 schematically shows a system comprising a MEMS sensor and a device, according to an embodiment.

FIG. 2 shows a system 1 comprising a device 2 and a MEMS sensor 3, the device 2 and the MEMS sensor 3 being operatively coupled to each other. For example, the MEMS sensor 3 may be housed in the device 2. In more detail, the MEMS sensor 3 may be integrated in the device 2.

The MEMS sensor 3 comprises at least a sensing assembly 5 and control circuitry 7 (which may be referred to herein as a control unit 7 and which may be of a known type, such as an ASIC, a PCB, or a dedicated processing unit), operatively coupled to each other (e.g., electrically and/or electromagnetically coupled to each other).

The sensing assembly 5 is of a known type, is arranged so as to be operatively coupled to the device 2 and includes one or more sensing elements (not shown and manufactured using MEMS technology). The sensing assembly 5 is the sensitive portion of the MEMS sensor 3, i.e., the portion configured to perform the sensing and/or the measurement of the desired quantity. The sensing assembly 5 is chosen, in a per se obvious manner to the skilled person, according to the application and the quantities to be sensed. For example, the sensing assembly 5 may include at least an inertial sensor, such as an accelerometer or a gyroscope, at least one environmental sensor, such as a pressure sensor, a temperature sensor or a humidity sensor, at least an audio sensor, such as a microphone, or other MEMS sensor, such as a magnetometer, a gas sensor, an ultraviolet or infrared radiation sensor (or even any combination of said sensors mentioned).

The control unit 7 includes at least a timer 15, hereinafter referred to as timer 15, and at least a module 17 configured and designed to implement a "neural network", NN, hereinafter thus referred to as NN module 17. The neural network implemented by the NN module 17 is an artificial neural network of a known type for pattern recognition. Examples of such neural network are: "Convolutional Neural Network" (CNN); "Recurrent Neural Network" (RNN); and "Feed-Forward Neural Network". In more detail, such neural network may include a "Multilayer Perceptron" (MLP) or a "Cellular Neural Network". Optionally, the neural network also includes a saturation block, for example, a block that implements a known "Softmax" function, to generate a saturated output. Furthermore, the control unit 7 may include at least a memory (not shown) of a known type, such as a volatile memory (e.g., "Random Access Memory"—RAM-, "Dynamic Random Access Memory"—DRAM-, "Static Random Access Memory", SRAM) or non-volatile memory (e.g., "Read Only memory"—ROM-, "Erasable Programmable Read Only Memory", EPROM).

According to an embodiment, the sensing assembly 5 and the control unit 7 are electrically connected to each other, in particular through an "Analog Front-End", AFE, unit 9, of a known type. The AFE 9 includes analog signal conditioning circuits using, for example, analog amplifiers (such as operational amplifiers), filters and integrated circuits, and thus allows the sensing assembly 5 to interface with the control unit 7.

Furthermore, an interface unit 11 of a per se known type (such as touch screen or keyboard) is operatively coupled to the control unit 7 and is operable by an operator to send commands to the control unit 7, as better discussed below. In particular, the interface unit 11 is included in the device 2 and coupled to the control unit 7 electrically (e.g., via cable), electromagnetically (e.g., via antenna) or through the Internet (e.g., through a wireless network such as a "Local Area Network", LAN).

Optionally there is also a signaling unit 13 (such as earphone, speaker or "Light Emitting Diodes", LEDs), operatively coupled to the control unit 7 and controlled by the latter to signal the occurrence of specific events to the operator, as better described below. In particular, the signaling unit 13 is included in the device 2 and coupled to the control unit 7 electrically, electromagnetically or through the Internet.

Figure 3:
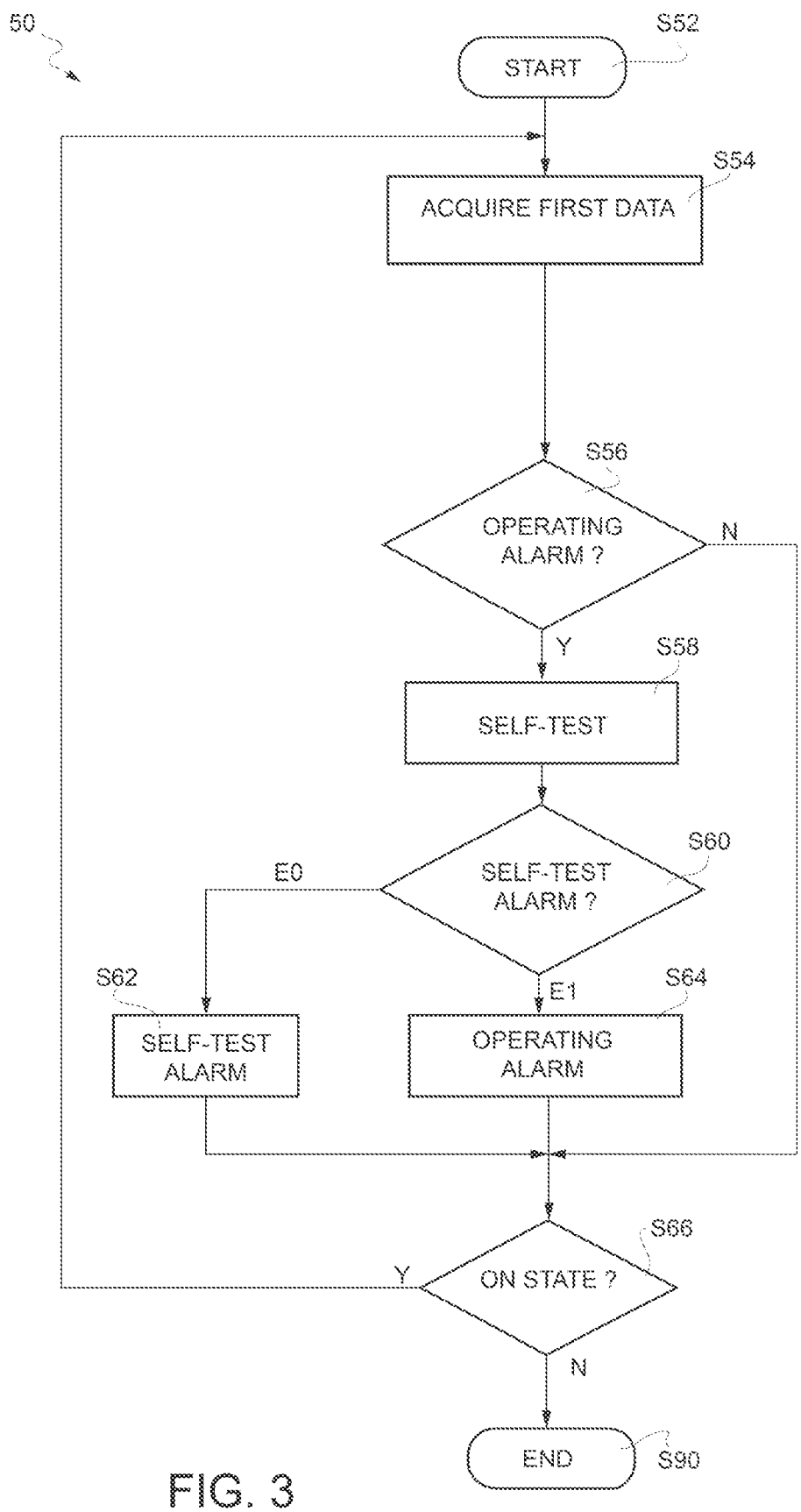
FIG. 3 shows a block diagram of an analysis method of the device of FIG. 2, according to an embodiment.

FIG. 3 shows an analysis method 50 of the device 2.

The analysis method 50 is performed iteratively through the control unit 7, and starts at a step S52. In other words, at step S52 the system 1 (and therefore the device 2 and the MEMS sensor 3) goes from an OFF state to an ON state following an automatic switch-on control or a manual selection by an operator performed through the interface unit 11.

At a step S54, consecutive to step S52, the control unit 7 acquires first data through the sensing assembly 5. Such first data includes the measurement performed by the sensing assembly 5, and is indicative of the properties (i.e., of an operating state) of the device 2.

In step S56, consecutive to step S54, it is tested whether an operating alarm condition exists. In particular, at step S56 it is tested whether the measurement acquired at step S54 meets a first relation. For example, it is tested whether the value of such measure is within a first range having a minimum value and a maximum value; in this case, the operating state of the device 2 is normal and no abnormal condition occurs; if, instead, the value of such measurement is not within the third range (i.e., it is lower than the minimum value of the third range or is higher than the maximum value of the third range), the operating state of the device 2 is abnormal. Possible examples of the device 2 and the operating states thereof are described below, with reference to FIGS. 6A-7.

If the operating state of the device 2 is abnormal (exit "Y" of step S56), the control unit 7 performs, at step S58, a self-test process (hereinafter also indicated with the reference number S58), better described below. In particular, at step S58 a self-test signal $E_{self-test}$, indicative of the result of the self-test process S58, is generated.

At step S60, consecutive to step S58, a self-test alarm condition is tested. In particular, if the self-test signal $E_{self-test}$ assumes a first value E0 (e.g., equal to 0), the operation of the sensing assembly 5 is abnormal; vice versa, if the self-test signal $E_{self-test}$ assumes a second value E1 (e.g., equal to 1), the sensing assembly 5 operates normally and correctly.

If the operation of the sensing assembly 5 is abnormal (exit "E0" of step S60), a self-test alarm is generated at step S62 in order to signal the abnormal operation of the sensing assembly 5 to the operator. For example, the self-test alarm includes a notification message shown to the operator through the interface unit 11, or a light and/or acoustic signal generated by the signaling unit 13.

If the operation of the sensing assembly 5 is normal and correct (exit "E1" of step S60), an operating alarm is generated at step S64 in order to signal the abnormal operation of the device 2 to the operator. The operating alarm may be similar to the self-test alarm, and therefore may include a notification message shown to the operator through the interface unit 11 or a light and/or acoustic signal generated by the signaling unit 13.

Following the generation of the self-test alarm at step S62 or the generation of the operating alarm at step S64, the ON state of the system 1 is tested at step S66. In other words, at step S66, it is tested whether the system 1 (and therefore the device 2 and the MEMS sensor 3) remains in the ON state.

If the system 1 is in the ON state (exit "Y" of step S66), the acquisition of the first data through the sensing assembly 5 is repeated, thus returning to step S54.

If the system 1 is in the OFF state (exit "N" of step S66), the analysis method 50 ends at step S90.

Furthermore, if the operating state of the device 2 is normal and correct (exit "N" of step S56), the analysis method 50 proceeds directly to step S66 for testing the ON state of the system 1.

Figure 3A:
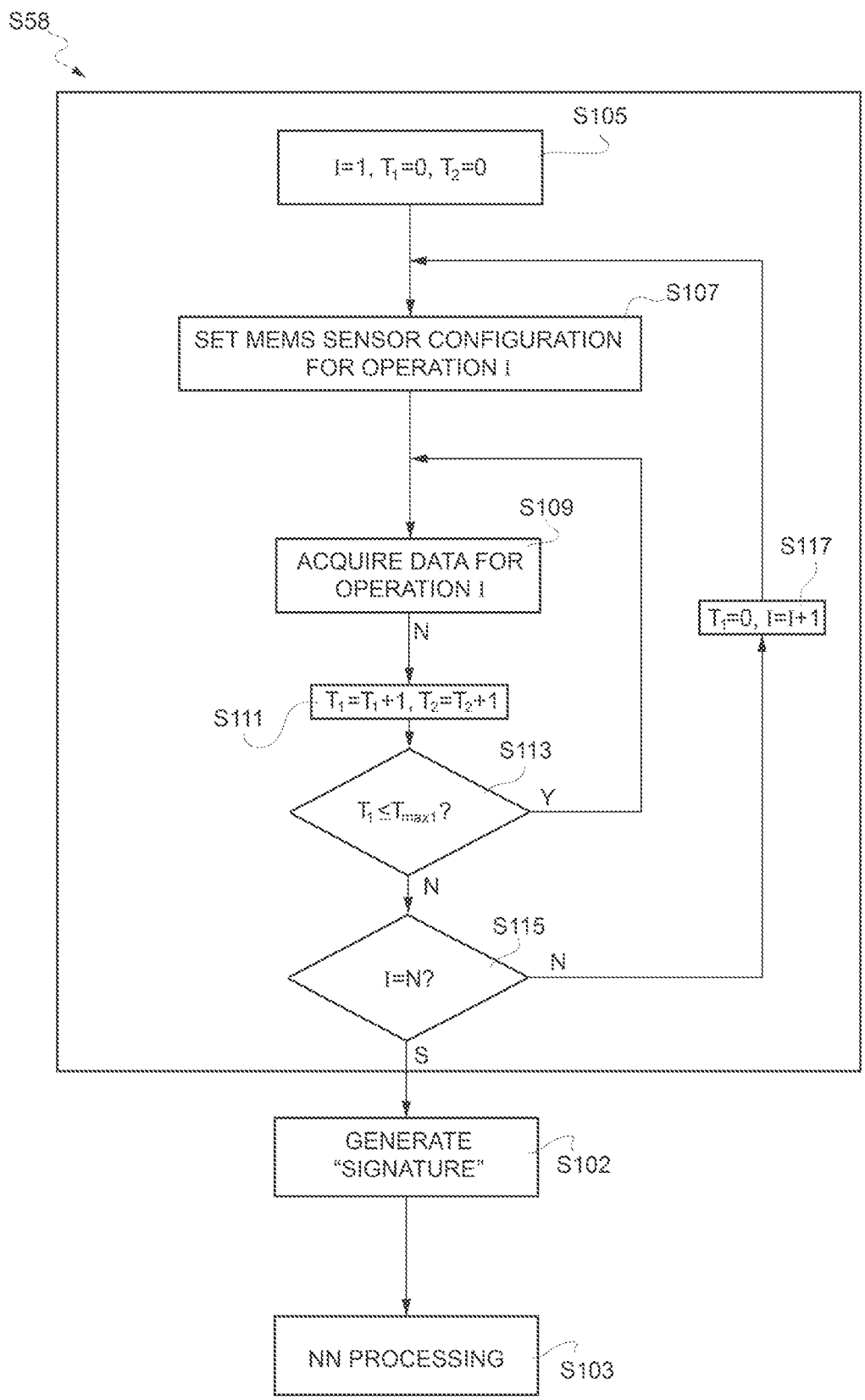
FIG. 3A shows in detail a block diagram of a step of the analysis method of FIG. 3, according to an embodiment.

FIG. 3A describes the self-test process S58 performed by the control unit 7.

In particular, the self-test process S58 includes a signal acquisition step S101, a signature generation step S102 and a NN processing step S103.

During the signal acquisition step S101, the control unit 7 acquires measurements through the sensing assembly 5, which is controlled to operate in a plurality of operating conditions different from each other, as better described below.

In particular, the signal acquisition step S101 begins with the initiation of parameters, at step S105. In detail, a parameter I, a first time $T_1$ and a second time $T_2$ are initiated. In more detail, the parameter I is initiated at an initial value (e.g., equal to 1) and may vary, as better described below, up to a maximum value N, corresponding to the maximum number of operating conditions of the sensing assembly 5. The first and the second times $T_1$, $T_2$ are stored and updated by the timer 15, in a per se known manner. At step S105, both the first and the second times $T_1$, $T_2$ are initiated at a respective initial value (in particular, equal to 0). As better described below, the first time $T_1$ may vary until it reaches a maximum value $T_{max1}$, while the second time $T_2$ may vary until it reaches a respective maximum value L, where $L=N \cdot T_{max1}$. In particular, the first time $T_1$ is the time necessary or otherwise desired to perform each operation, i.e., the time wherein the sensing assembly 5 remains in each of the operating configurations. The second time $T_2$ is the measurement acquisition total time through the sensing assembly 5, i.e., the time necessary or otherwise desired to operate the sensing assembly 5 in all the N operating configurations. Furthermore, although in the present description the maximum value $T_{max1}$ of the first time $T_1$ is considered the same for each operating configuration of the sensing assembly 5, it is noted that such maximum value $T_{max1}$ may be specific and different for each of the different operating configurations.

At step S107, consecutive to step S105, the MEMS sensor 3 is set to operate in the operating configuration referred to the parameter I. Such operating configuration depends, in a known and obvious manner to the skilled person, on the specific application and on the sensing assembly 5 used. For example, the operating configuration may concern the application of bias voltages and different operating configurations may correspond to different bias conditions of each sensing element of the sensing assembly 5.

At step S109, consecutive to step S107, the control unit 7 acquires second data through the sensing assembly 5, set in the operating configuration indicated by the parameter I, and stores it in the memory. In particular, such second data includes the measurement performed at the second time $T_2$ by the sensing assembly 5. Such measurement is stored in a matrix V, as better described below.

At step S111, consecutive to step S109, both the first and the second times $T_1$, $T_2$ are updated. In particular, each time $T_1$, $T_2$ is increased by one unit (i.e., $T_1=T_1+1$ and $T_2=T_2+1$).

At step S113, consecutive to step S111, it is tested whether a condition exists on the first time $T_1$, in particular whether the first time $T_1$ meets a second relation with respect to the maximum value $T_{max1}$. In more detail, at step S113 it is tested whether $T_1 \leq T_{max1}$.

If the second relation is met (exit "Y" of step S113, i.e., $T_1 \leq T_{max1}$), the acquisition and storage of the second data is repeated, thus returning to step S109.

If the second relation is not met (exit "N" of step S113, i.e., $T_1 > T_{max1}$), it is tested whether, at step S115, a condition exists on the parameter I, in particular whether the parameter I meets a third relation with N. In more detail, at step S115 it is tested whether I=N.

If the third relation is not true (exit "N" of step S115, i.e., I≠N), the parameter I is updated at step S117. In particular, the parameter I is increased by one unit (i.e., I=I+1). Furthermore, at step S117, the first time $T_1$ is also reset. In particular, the first time $T_1$ is initiated again at the initial value thereof (i.e., equal to 0). After step S117, the setting of the MEMS sensor 3 is repeated, thus returning to step S107.

If the third relation is met (exit "Y" of step S115, i.e., I=N), the signal acquisition step S101 ends and the signature generation step S102 is performed.

With reference to the storage of the measurements performed at step S109 in the matrix V, two cases are possible: in the first case, the sensing assembly 5 includes a plurality K of sensing elements different from each other; in the second case, the sensing assembly 5 includes a single sensing element which, however, has, in each operating configuration, a plurality K of outputs different from each other (i.e., allows, in each operating configuration, K measurements or output signals different from each other). Examples of such two cases are provided with reference to FIGS. 6A-7. In both cases, the matrix V is of a two-dimensional type and has dimensions K×L (first dimension K of the rows and second dimension L of the columns). Each row of the matrix V corresponds to a respective sensing element (first case) or to a respective output (second case), while each column corresponds to a respective value of the second time Ta, and thus groups of columns correspond to operating configurations different from each other. Considering a first index i (indicative of an i-th sensing element or, alternatively, of an i-th measurement, and such that $0 \leq i \leq K-1$) and a second index j (indicative of a j-th instant of the second time $T_2$, and such that $0 \leq j \leq L$), each measurement performed at step S109 is indicated by a respective pair of indices i,j and is stored in the element V(i,j) of the matrix V.

With reference to the signature generation step S102, the signature F is generated by the control unit 7 according to the measurements performed and stored at step S109, and therefore to the matrix V. In particular, the signature F is a vector having dimension L, and each element F(j) of the signature F represents a value of the signature F at the respective j-th instant of the second time Ta. Examples of such signature F are provided below with reference to FIGS. 6B-7. According to an embodiment, the signature F is calculated through a sum by columns of the matrix V. In other words, each element F(j) is calculated by adding all the elements of the j-th column of the matrix V, i.e., according to the mathematical expression $F(j) = \sum_{i=0}^{K-1} V(i, j)$. According to a further embodiment, the signature F is calculated through a weighted sum by columns of the matrix V, that is the mathematical expression $F(j) = \sum_{i=0}^{K-1} a(i) \cdot V(i, j)$ is valid, where a is a vector (with dimension K) of coefficients having the function of weighing and modulating the contribution of the respective elements of the matrix V they are applied to. According to a further embodiment, the signature F is calculated through a normalized sum by columns of the matrix V, or through a sum by columns of the matrix V wherein each row is previously normalized. According to a further embodiment, the signature F is calculated through a mean by columns of the matrix V, that is, the mathematical expression $F(j) = 1/N \cdot \sum_{i=0}^{K-1} V(i, j)$ is valid.

During the NN processing step S103, consecutive to the signature generation step S102, the control unit 7 processes, through "Deep Learning" techniques, the signature F and generates the self-test signal $E_{self-test}$ according to such processing of the signature F. In particular, the neural network implemented by the NN module 17 receives the signature F as an input, processes it according to a training discussed below, and generates the self-test signal $E_{self-test}$ as an output.

In particular, such neural network is previously trained on a training dataset comprising a suitable amount of training signatures (e.g., comprising a hundred training signatures). In detail, the neural network undergoes a supervised training process. Each training signature in the training dataset is associated with a respective training self-test signal, and the neural network receives, as an input, both the training signatures and the respective training self-test signals. In a per se known manner, the neural network iteratively updates weight parameters, included therein, so as to minimize an assignment error. This assignment error so is, for each training signature and at each iteration, a difference (e.g., Euclidean distance) between the respective training self-test signal and a respective self-test signal calculated and assigned during such iteration by the neural network to such training signature.

Figure 4:
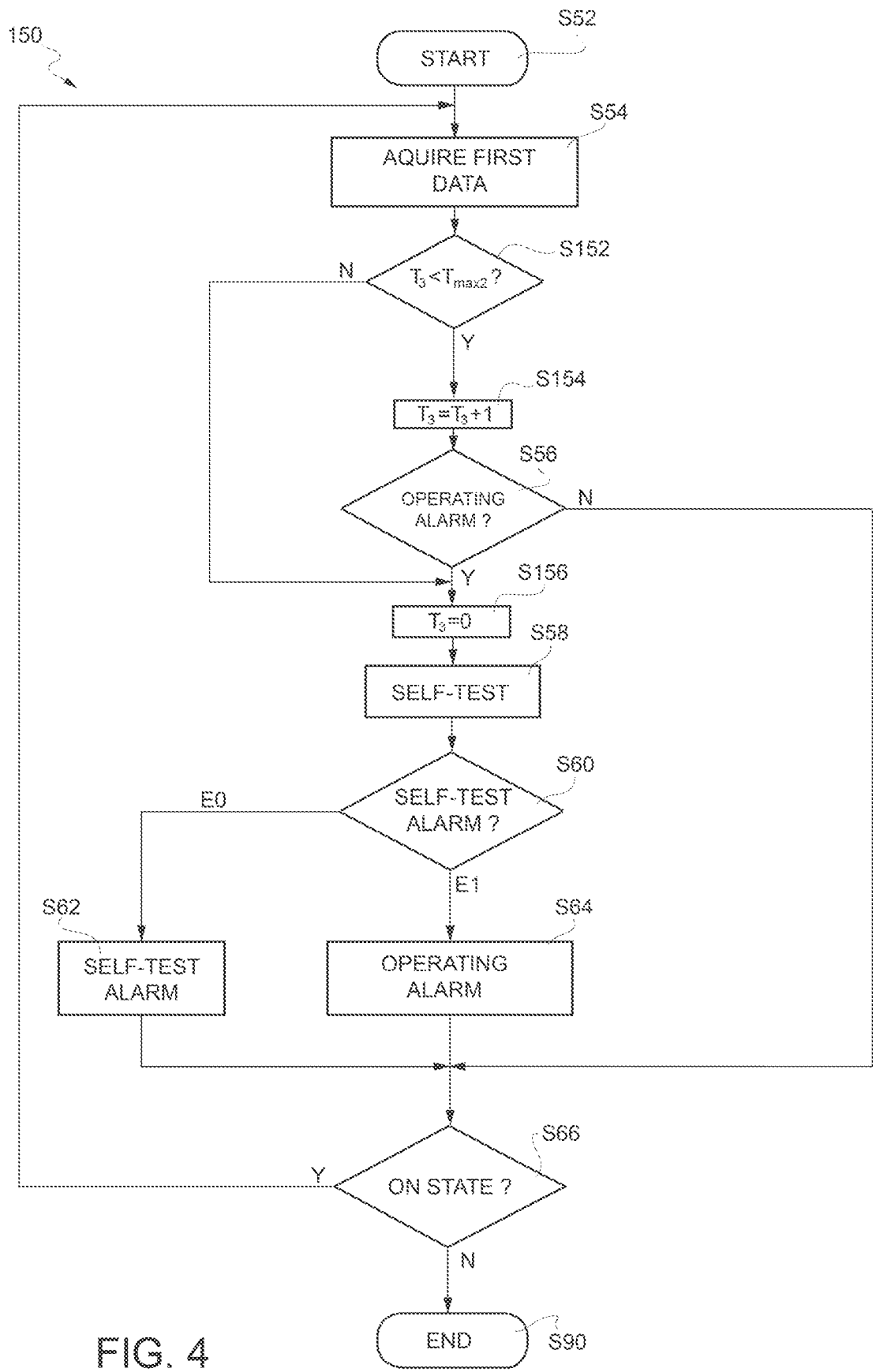
FIGS. 4-5 show respective block diagrams of further embodiments of the analysis method of the device of FIG. 2.

FIG. 4 shows a further embodiment of the analysis method, indicated here with the reference number 150. The analysis method 150 is similar to the analysis method 50 of FIG. 3, but includes a further control on the performance of the self-test process S58. The steps of the analysis method 150 of FIG. 4 similar to those of the analysis method 50 of FIG. 3 have therefore been indicated with the same reference numbers.

In particular, in the analysis method 150, the self-test process S58 is performed both when the operating state of the device 2 is abnormal (exit "Y" of step S56) and periodically (i.e., upon reaching a maximum time), and for that purpose a third time count is used, indicated hereinbelow as third time $T_3$.

In more detail, following the acquisition of the first data performed at step S54, it is tested whether a condition exists on the third time $T_3$. The third time $T_3$ is stored and updated by the timer 15, and is initiated at an initial value thereof (in particular, equal to 0) at step S52. The third time $T_3$ may change up to a maximum value $T_{max2}$. At step S152 it is tested whether the third time $T_3$ meets a fourth relation with the maximum value $T_{max2}$. In detail, at step S152 it is tested whether $T_3 < T_{max2}$.

If the fourth relation is met (exit "Y" of step S152, i.e., $T_3 < T_{max2}$), the third time $T_3$ is updated at step S154, consecutive to step S152. In particular, the third time $T_3$ is increased by one unit (i.e., $T_3 = T_{3+1}$).

Consecutively to step S154, the operating alarm condition is tested (step S56, see also what indicated with reference to FIG. 3).

If the operating state of the device 2 is abnormal (exit "Y" of step S56), the third time $T_3$ is reset at step S156. Consecutively to step S156, the self-test process S58 (described with reference to FIG. 3A) is performed and the analysis method 150 then continues with steps S60-S90 described above.

If the fourth relation is not met (exit "N" of step S152, i.e., $T_3 = T_{max2}$), the analysis method 150 proceeds directly to step S156.

Figure 5:
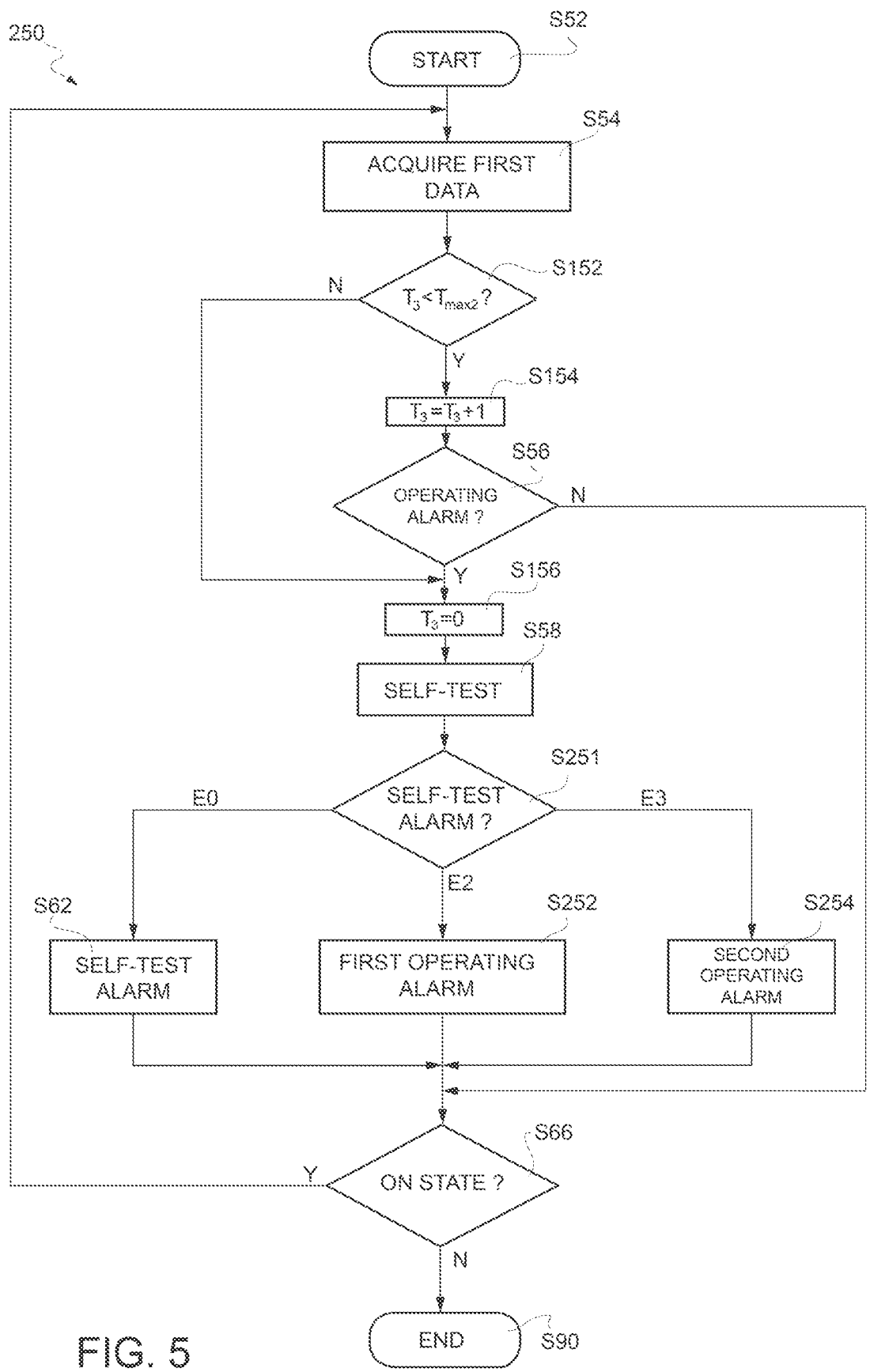

FIG. 5 shows a further embodiment of the analysis method, here indicated with the reference number 250. The analysis method 250 is similar to the analysis method 150, but includes a plurality of operating alarms allowing the operator to be notified, by the control unit 7, of a malfunction of respective portions (not shown) of the device 2. Therefore not only the generalized malfunction of the device 2, but also the portion of the device 2 causing this malfunction may be identified and signaled. For example, if the device 2 comprises a heating system and a cooling system, it is possible to identify whether the malfunction of the device 2 is caused by the heating system or by the cooling system.

In the present embodiment, the neural network implemented at step S58 (in the self-test process S58) is trained, in a per se known manner and similar to what previously discussed, to identify malfunctions of a plurality of portions included in the device 2. In detail, the self-test signal $E_{self-test}$ generated by the neural network assumes here one of the following values: the first value E0 (previously discussed in FIG. 3), indicative of the abnormal operation of the sensing assembly 5; a third value E2 (e.g., equal to 1), indicative of the normal operation of the sensing assembly 5 and of the abnormal operation of a first portion (not shown) of the device 2; and a fourth value E3 (e.g., equal to 2), indicative of the normal operation of the sensing assembly 5 and of the abnormal operation of a second portion (not shown) of the device 2.

At step S251, consecutive to step S58, the presence of a self-test alarm condition is tested. In particular, if the self-test signal $E_{self-test}$ assumes the first value E0, the operation of the sensing assembly 5 is abnormal; if the self-test signal $E_{self-test}$ assumes the third value E2, the sensing assembly 5 operates normally and correctly and the operation of the first portion of the device 2 is abnormal; and if the self-test signal $E_{self-test}$ assumes the fourth value E3, the sensing assembly 5 operates normally and correctly and the operation of the second portion of the device 2 is abnormal.

If the operation of the sensing assembly 5 is abnormal (exit "E0" of step S251), the self-test alarm is generated at step S62, as previously discussed with reference to FIG. 3. If the operation of the sensing assembly 5 is normal and the operation of the first portion of the device 2 is abnormal (exit "E2" of step S251), a first operating alarm is generated at step S252 in order to signal the abnormal operation of the second portion of the sensing assembly 5 to the operator. If the operation of the sensing assembly 5 is normal and the operation of the second portion of the device 2 is abnormal (exit "E3" of step S251), a second operating alarm is generated at step S254 in order to signal the abnormal operation of the second portion of the sensing assembly 5 to the operator. For example, each operating alarm includes a respective notification message shown to the operator through the interface unit 11, or a respective light and/or acoustic signal generated by the signaling unit 13.

Figure 6A:
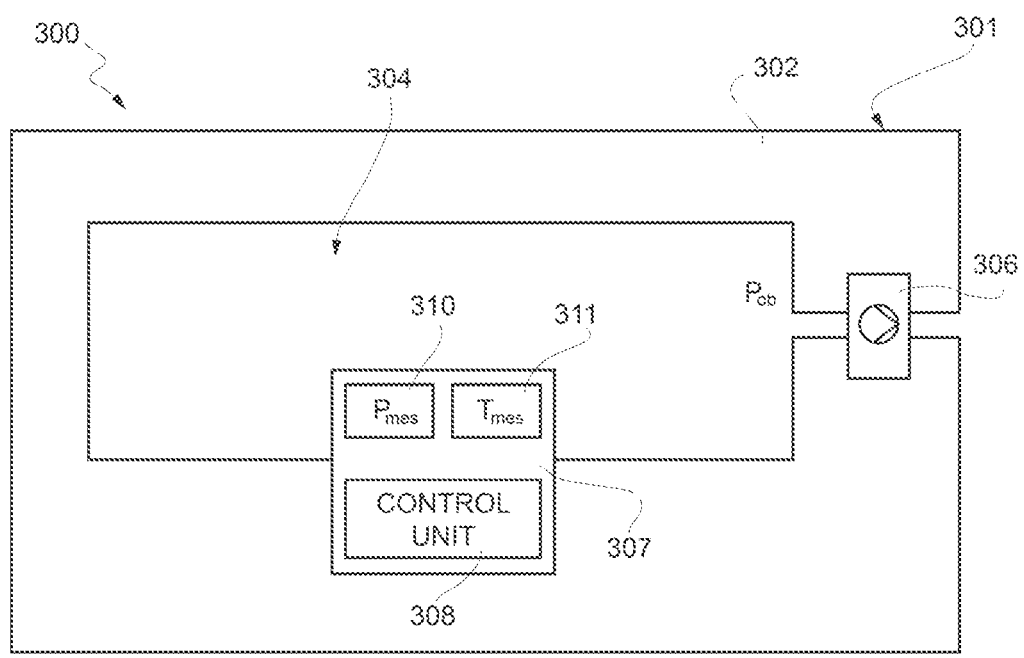
FIG. 6A schematically shows a system including a MEMS sensor and a device, according to a further embodiment.

With reference to FIG. 6A, a different embodiment of the present system is shown, indicated here with the reference number 300. The system 300 includes a device (here, device 301) comprising a body 302 defining an internal chamber 304 fluidically connected with a volume external to the body 302 (the outside of the body 302) through a pumping assembly 306 included in the device 301 and operable to maintain a pressure $P_{ob}$ inside the internal chamber 304. The internal chamber 304 houses the MEMS sensor, indicated here with the reference number 307. The MEMS sensor 307 comprises the control unit (here, indicated with 308) and the sensing assembly (here, indicated with 309). In particular, the sensing assembly 309 comprises: a pressure sensor 310, arranged in the internal chamber 304 so as to acquire and sense a measured pressure $P_{mes}$ of the internal chamber 304; and a temperature sensor 311, arranged in the internal chamber 304 so as to acquire and sense a measured temperature $T_{mes}$ of the internal chamber 304. During the use of the device 301, one of the following cases occurs: the pumping assembly 306 operates correctly (normal operating state) if the pressure $P_{mes}$ measured by the pressure sensor is approximately equal to the pressure $P_{ob}$, i.e., if the measured pressure $P_{mes}$ belongs to a pre-determined pressure range; or the pumping assembly 306 operates abnormally (abnormal operating state) if the measured pressure $P_{mes}$ does not belong to the default pressure range. For example, such default pressure range has a maximum pressure value $P_{max}=P_{ob}+P_k$ and a minimum pressure value $P_{min}=P_{ob}-P_k$, where $P_k$ is a default pressure value (for example, $P_k=0.05 \cdot P_{ob}$). If the measured pressure $P_{mes}$ does not belong to the default pressure range, there is an operating alarm condition (the exit of step S56 of FIG. 5 is "Y") and, with reference again to the analysis method 250 of FIG. 5, the operating test of the MEMS sensor 307 is performed by processing (step S58), through the neural network, the second acquired data, i.e., the measured temperature $T_{mes}$ and the measured pressure $P_{mes}$, to generate the self-test signal $E_{self-test}$.

The operating state of the device 301 is examined through the analysis method 50 of FIG. 3. In particular, in the present embodiment, at step S101 of FIG. 3A, the vectors of the measured temperature $T_{mes}$ and the measured pressure $P_{mes}$ are acquired through the sensing assembly 5 (FIG. 2), and at step S102 are normalized and added to each other to generate the signature F, being then processed, at step S103, by the neural network. In detail, at step S101, each operation I corresponds to a respective pair of "Output Data Rate" (ODR) and filter level (e.g., low-pass filter applied to the sensing assembly 5) values of the sensing assembly 5. At step S102 the following mathematical operations are performed:

$$P_{mes,norm} = \frac{[P_{mes} - P_{min}]}{[P_{max} - P_{min}]}$$

where $P_{mes,norm}$ is a normalized acquired pressure, $P_{min}$ is a minimum full-scale pressure value of the pressure sensor 310, $P_{max}$ is a maximum full-scale pressure value of the pressure sensor 310, $T_{mes,norm}$ is a normalized acquired temperature, $T_{min}$ is a minimum full-scale temperature value of the temperature sensor 311 and $T_{max}$ is a maximum full-scale temperature value of the temperature sensor 311.

Figures 6B, 6C:
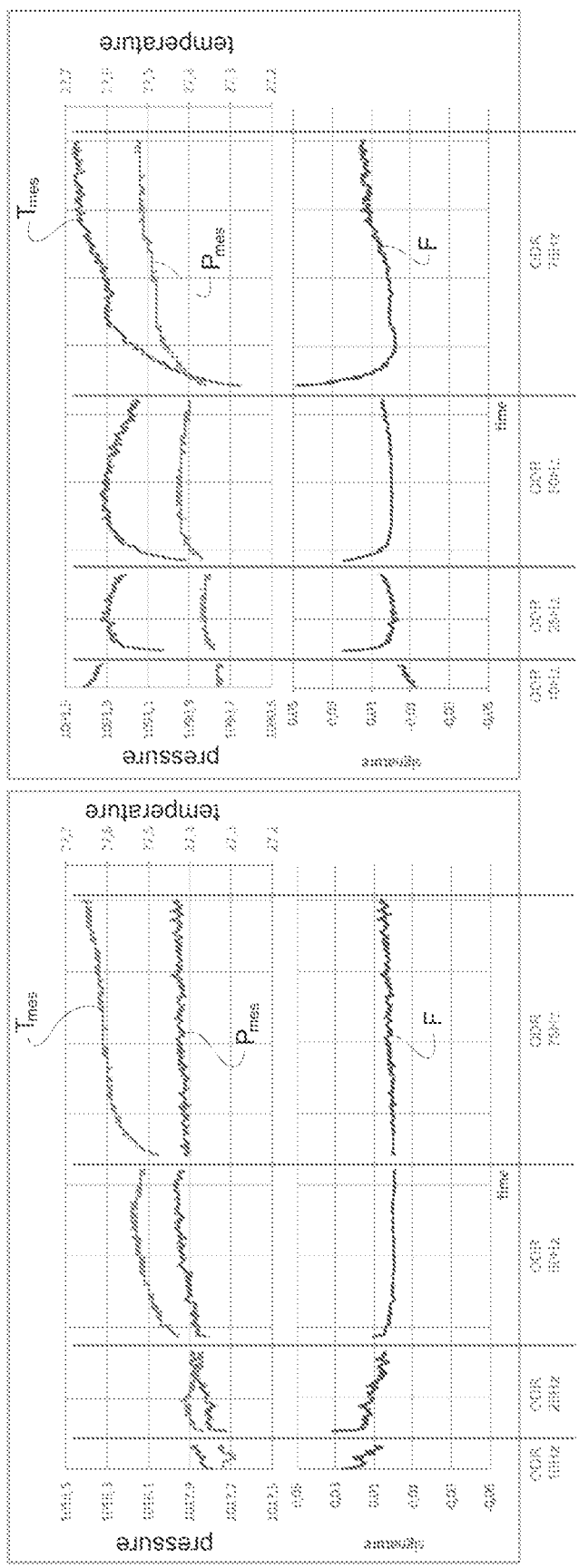
FIGS. 6B-6C show respective diagrams with signals acquired and processed according to the analysis method performed through the MEMS sensor of FIG. 6A, in a normal operating state of the MEMS sensor and, respectively, in an abnormal operating state of the MEMS sensor, according to an embodiment.

FIGS. 6B, 6C show respective diagrams of experimental measurements carried out reporting the signatures F in case the pressure sensor 310 operates normally and, respectively, in case it operates abnormally. In particular, it is noted that, in the case of FIG. 6C, there are peaks of the signature F absent in the signature F of FIG. 6A. Such peaks may be caused, for example, by the "clogging" effect of the pressure sensor 310.

Figure 7:
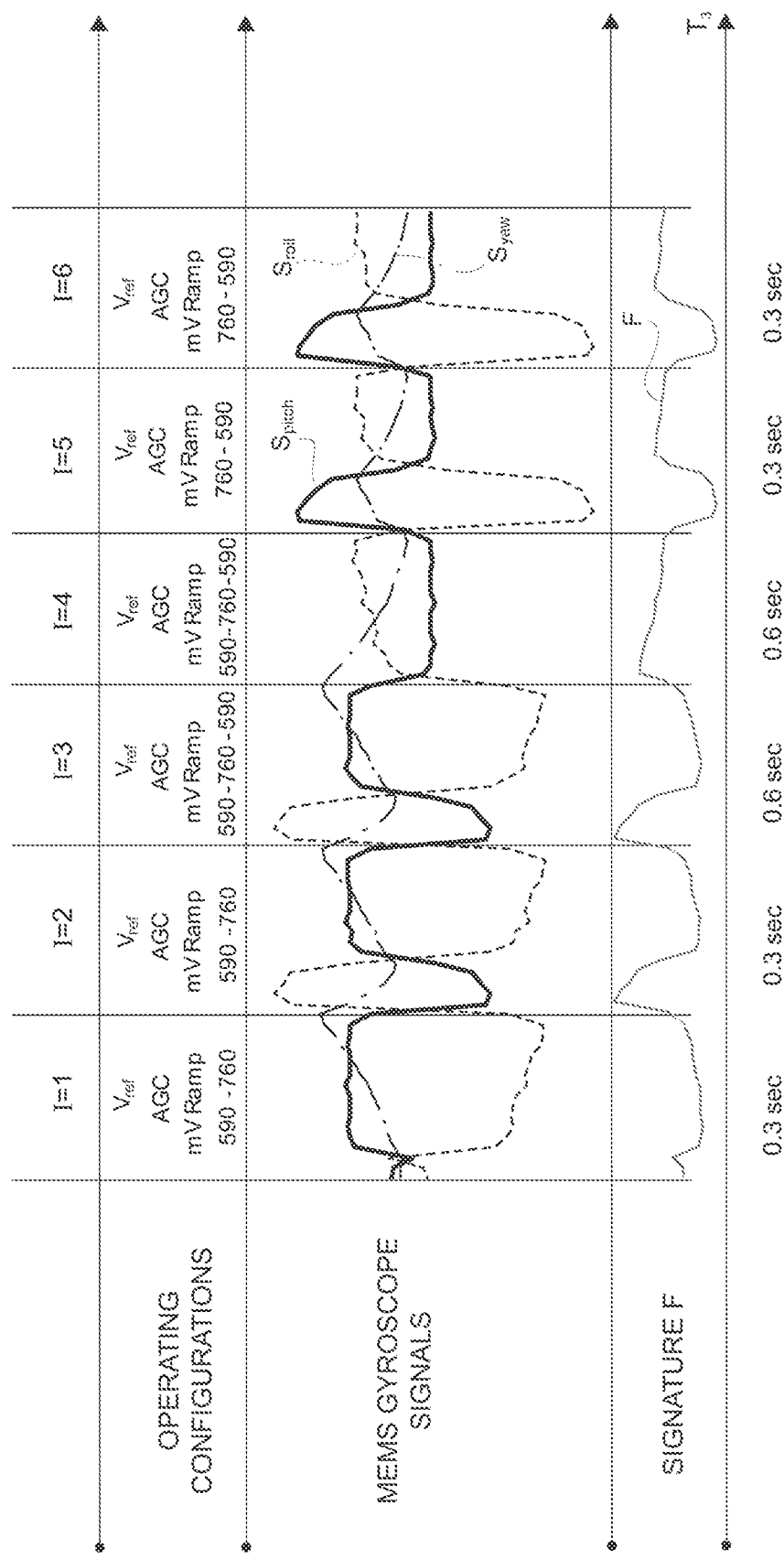
FIG. 7 shows a diagram with signals acquired and processed according to the analysis method of the device of FIG. 2 through the MEMS sensor, according to a further embodiment.

FIG. 7 shows instead the signature F obtained through experimental measurements related to a system 1 wherein the sensing assembly 5 comprises a MEMS gyroscope. In this case, during the acquisition of the second data (step S109 of FIG. 3A), three signals (outputs) of a triaxial MEMS gyroscope have been acquired simultaneously, each signal being indicative of a rotational speed along a respective rotation axis. In particular, such signals are a pitch signal $S_{pitch}$, a roll signal $S_{roll}$ and a yaw signal $S_{yaw}$. In this case, each operation I corresponds to the application of a particular ramp (e.g., slope, rise/fall time) of a reference voltage $V_{ref}$ the gyroscope is biased with so as to simulate, in a per se known manner, the effect of an external force acting thereon. The signature F is obtained here by adding the pitch signal $S_{pitch}$, the roll signal $S_{roll}$ and the yaw signal $S_{yaw}$.

From an examination of the characteristics of the present method, the advantages it allows to obtain are apparent.

In particular, an improved self-test process of the MEMS sensor 3 may be implemented, wherein the result of the measurement performed by the sensing assembly 5 is validated and confirmed through a test by the same sensing assembly 5.

Such test is performed every time the sensing assembly 5 senses an anomaly in the operation of the device 2 (i.e., it is performed as soon as the anomaly is sensed), improving the reliability thereof.

Furthermore, such test is performed periodically in order to maintain constant control over the sensing assembly 5.

The present method allows the device 2 to continuously perform its operations, that is, without having to be temporarily disabled to allow the self-test to be performed. In fact, here, the MEMS sensor 3, when an abnormal operating condition of the device 2 is sensed, is the only one to stop its monitoring and diagnosis activity of the device 2 to perform the self-test process S58.

The use of the neural network allows the recognition reliability of the signatures F to be further improved.

This method may be applied to inertial sensor industrial market applications, such as vibration monitoring or predictive maintenance, but might also be applied to all applications requiring or otherwise benefitting from an integrated self-test for the sensing assembly 5.

Finally, it is clear that modifications and variations may be made to the method and system described and illustrated here without thereby departing from the scope of protection of the present disclosure, as defined in the attached claims.

In particular, the device 2 and/or the MEMS sensor 3 may be induced, according to the self-test signal $E_{self-test}$, to modify the respective operating and/or mechanical configurations. For example, if the operation of the sensing assembly 5 is abnormal (exit "E0" of step S60), a first control may be generated by the control unit 7 to replace the sensing assembly 5 automatically and mechanically. Similarly, if the operation of the sensing assembly 5 is normal and the operation of the first (similarly, second) portion of the device 2 is abnormal (exit "E2" and, respectively, "E3" of step S251), a second control may be generated by the control unit 7 to replace the first (respectively, second) portion of the device 2 automatically and mechanically.

Furthermore, the operations performed by the NN module 17 and/or by the control unit 7 may be implemented remotely through one or more external servers, for example, through "cloud". In this case, the sensing assembly 5 and such external servers are mutually coupled via the Internet.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a device; and
a Micro Electro-Mechanical Systems (MEMS) sensor, the MEMS sensor including a sensing assembly operatively coupled to the device, and a control unit operatively coupled to the sensing assembly, the control unit configured to:
acquire, through the sensing assembly, first data indicative of an operative state of the device;
test for the presence of a first abnormal operating condition of the device, by testing whether the first data meets a defined relation with respect to one or more reference values; and
if the first abnormal operating condition of the device is confirmed, performing a self-test of the sensing assembly to generate a quantity indicative of an operative state of the sensing assembly,
the control unit being further configured to:
acquire, through the sensing assembly, second data indicative of the operative state of the sensing assembly; and
generate a signature according to the second data,
wherein a deep learning module is operatively coupled to the control unit and is configured to process the signature through deep learning techniques to generate said quantity.

2. The system according to claim 1, wherein the MEMS sensor includes at least one of: an accelerometer, a gyroscope, a pressure sensor, a temperature sensor, an audio sensor, a gas sensor, an ultraviolet radiation sensor, an infrared radiation sensor, a humidity sensor, or a magnetometer.

3. The system according to claim 1, wherein the device includes a body defining an internal chamber fluidically connected with a volume external to the body through a pumping assembly included in the device and operable to maintain a pressure value inside the internal chamber,
wherein the internal chamber accommodates said MEMS sensor,
wherein the sensing assembly includes a pressure sensor and a temperature sensor arranged in the internal chamber, and
wherein the control unit is configured to acquire the second data including a measured pressure of the internal chamber, through the pressure sensor, and a measured temperature of the internal chamber, through the temperature sensor.

4. The system according to claim 1, wherein the sensing assembly of the MEMS sensor includes a MEMS gyroscope, and
wherein the control unit is configured to acquire, through said MEMS gyroscope, the second data including a plurality of signals, each of the plurality of signals being indicative of a respective rotation of the MEMS gyroscope along a respective rotation axis of the MEMS gyroscope.

5. A Micro Electro-Mechanical Systems (MEMS) sensor, comprising:
a sensing assembly configured to be coupled to a device; and
control circuitry operatively coupled to the sensing assembly, the control circuitry configured to:
acquire, through the sensing assembly, first data indicative of an operative state of the device;
test for the presence of a first abnormal operating condition of the device, by testing whether the first data meets a defined relation with respect to one or more reference values; and
if the first abnormal operating condition of the device is confirmed, performing a self-test of the sensing assembly to generate a quantity indicative of an operative state of the sensing assembly,
wherein the self-test comprises:
acquiring, by the control circuitry and through the sensing assembly, second data indicative of the operative state of the sensing assembly;
generating, by the control circuitry, a signature according to the second data; and
processing, by a deep learning module operatively coupled to the control circuitry, the signature through deep learning techniques to generate said quantity.

6. The MEMS sensor according to claim 5, wherein the MEMS sensor includes at least one of: an accelerometer, a gyroscope, a pressure sensor, a temperature sensor, an audio sensor, a gas sensor, an ultraviolet radiation sensor, an infrared radiation sensor, a humidity sensor, or a magnetometer.

7. The MEMS sensor according to claim 5, wherein the sensing assembly of the MEMS sensor includes a MEMS gyroscope, and
 wherein the control circuitry is configured to acquire, through said MEMS gyroscope, the second data including a plurality of signals, each of the plurality of signals being indicative of a respective rotation of the MEMS gyroscope along a respective rotation axis of the MEMS gyroscope.

8. The MEMS sensor according to claim 5, wherein the control circuitry is configured to acquire the second data by:
 setting the sensing assembly in a plurality of operating configurations; and
 for each of said operating configurations of the sensing assembly, storing in a matrix measurements acquired through the sensing assembly.

9. The MEMS sensor according to claim 5, wherein the control circuitry is configured to test whether the first data meet a defined relationship with respect to one or more reference values by determining whether the first data has a value that is between a first reference value and a second reference value.

\* \* \* \* \*